(12) United States Patent
Hu et al.

(10) Patent No.: US 10,101,016 B2
(45) Date of Patent: Oct. 16, 2018

(54) LIGHTING APPARATUS

(71) Applicant: EPISTAR CORPORATION, Hsinchu (TW)

(72) Inventors: Wei-Chiang Hu, Hsinchu (TW); Ming-Huang Hsu, Hsinchu (TW); Chiu-Lin Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 33 days.

(21) Appl. No.: 15/066,609

(22) Filed: Mar. 10, 2016

(65) Prior Publication Data

US 2016/0356476 A1 Dec. 8, 2016

(30) Foreign Application Priority Data

Jun. 8, 2015 (TW) .............................. 104118453 A

(51) Int. Cl.
*F21V 23/00* (2015.01)
*F21V 29/503* (2015.01)
*F21V 3/00* (2015.01)
*F21V 29/70* (2015.01)
*F21V 29/89* (2015.01)
*F21V 3/02* (2006.01)
*F21K 9/23* (2016.01)
*F21K 9/238* (2016.01)
*F21Y 115/10* (2016.01)
*F21Y 107/90* (2016.01)
*F21Y 101/00* (2016.01)

(52) U.S. Cl.
CPC .............. *F21V 29/503* (2015.01); *F21K 9/23* (2016.08); *F21K 9/238* (2016.08); *F21V 3/00* (2013.01); *F21V 3/02* (2013.01); *F21V 23/005* (2013.01); *F21V 29/70* (2015.01); *F21V 29/89* (2015.01); *F21Y 2101/00* (2013.01); *F21Y 2107/90* (2016.08); *F21Y 2115/10* (2016.08); *H01L 2224/48091* (2013.01); *H01L 2224/48137* (2013.01)

(58) Field of Classification Search
CPC .......... F21K 9/23; F21K 9/238; F21V 23/005; F21V 19/002; F21Y 2115/10; F21Y 2107/90
See application file for complete search history.

(56) References Cited

U.S. PATENT DOCUMENTS 6,964,510 B2 * 11/2005 Galli ...................... H01H 36/00
335/205
8,314,566 B2 * 11/2012 Steele ...................... F21V 7/00
315/185 R (Continued)

FOREIGN PATENT DOCUMENTS

EP          2065931 A1    6/2009
WO    WO2011/107925 A1   9/2011
(Continued)

*Primary Examiner* — Peggy Neils
(74) *Attorney, Agent, or Firm* — Muncy, Geissler, Olds & Lowe, P.C.

(57) ABSTRACT

A lighting apparatus includes a carrier, a first light-emitting element, and a cover body. The carrier has a top surface. The first light-emitting element is formed on the top surface. The cover body covers the carrier and exposes the first light-emitting element. The lighting apparatus has a luminous flux greater than 350 lumens.

20 Claims, 14 Drawing Sheets

(56) References Cited

U.S. PATENT DOCUMENTS

| | | | | |
|---|---|---|---|---|
| 8,525,396 | B2* | 9/2013 | Shum | F21V 17/164 |
| | | | | 313/46 |
| 8,772,794 | B2* | 7/2014 | Lee | H01L 25/0753 |
| | | | | 257/166 |
| 8,985,813 | B2* | 3/2015 | Zaderej | F21S 2/005 |
| | | | | 362/249.02 |
| 9,080,745 | B2* | 7/2015 | Quaal | F21V 15/01 |
| 9,439,299 | B2* | 9/2016 | Tudhope | F21V 23/005 |
| 9,562,675 | B2* | 2/2017 | Ahmed | F21V 19/002 |
| 2004/0257808 | A1* | 12/2004 | Bjornson | A61N 5/062 |
| | | | | 362/249.01 |
| 2006/0158881 | A1* | 7/2006 | Dowling | G03G 15/0435 |
| | | | | 362/231 |
| 2014/0204582 | A1 | 7/2014 | Chien | |
| 2016/0084485 | A1* | 3/2016 | Bowcutt | F21V 21/406 |
| | | | | 362/191 |
| 2016/0223174 | A1* | 8/2016 | Inscore | F21V 23/005 |

FOREIGN PATENT DOCUMENTS

| | | | |
|---|---|---|---|
| WO | WO2014/087357 | A1 | 6/2014 |
| WO | WO2014/132186 | A1 | 9/2014 |

\* cited by examiner

LIGHTING APPARATUS

CROSS-REFERENCE TO RELATED APPLICATIONS

The present application is a non-provisional patent application, claiming the benefit of priority of TW Patent Application No. 104118453 filed on Jun. 8, 2015.

TECHNICAL FIELD

The present disclosure relates to a lighting apparatus and in particular to a lighting apparatus directly exposed to environment

DESCRIPTION OF THE RELATED ART

The light-emitting diodes (LEDs) of the solid-state light-emitting elements have the characteristics of low power consumption, long operational life, small volume, quick response and stable opto-electrical property of emitted light, such as wavelength or luminous intensity so the conventional lighting fixtures are gradually replaced by LEDs.

The LEDs emit light and generate heat during a period of operating under a current. If the heat from the LEDs cannot be dissipated properly, after a while, the temperatures of the LEDs are gradually increased and induce degradation of the lighting efficiencies of the LEDs.

SUMMARY OF THE DISCLOSURE

A lighting apparatus includes a carrier, a first light-emitting element, and a cover body. The carrier has a top surface. The first light-emitting element is formed on the top surface. The cover body covers the carrier and exposes the first light-emitting element. The lighting apparatus has a luminous flux greater than 350 lumens.

A lighting apparatus includes a carrier, a light-emitting element, a cover and a cover body. The carrier has a top surface. The light-emitting element is formed on the top surface. The cover element is formed on the light-emitting element. The cover body covers the carrier and exposes the first light-emitting element.

The following description illustrates embodiments and together with drawings to provide a further understanding of the disclosure described above.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

Figure 1A:
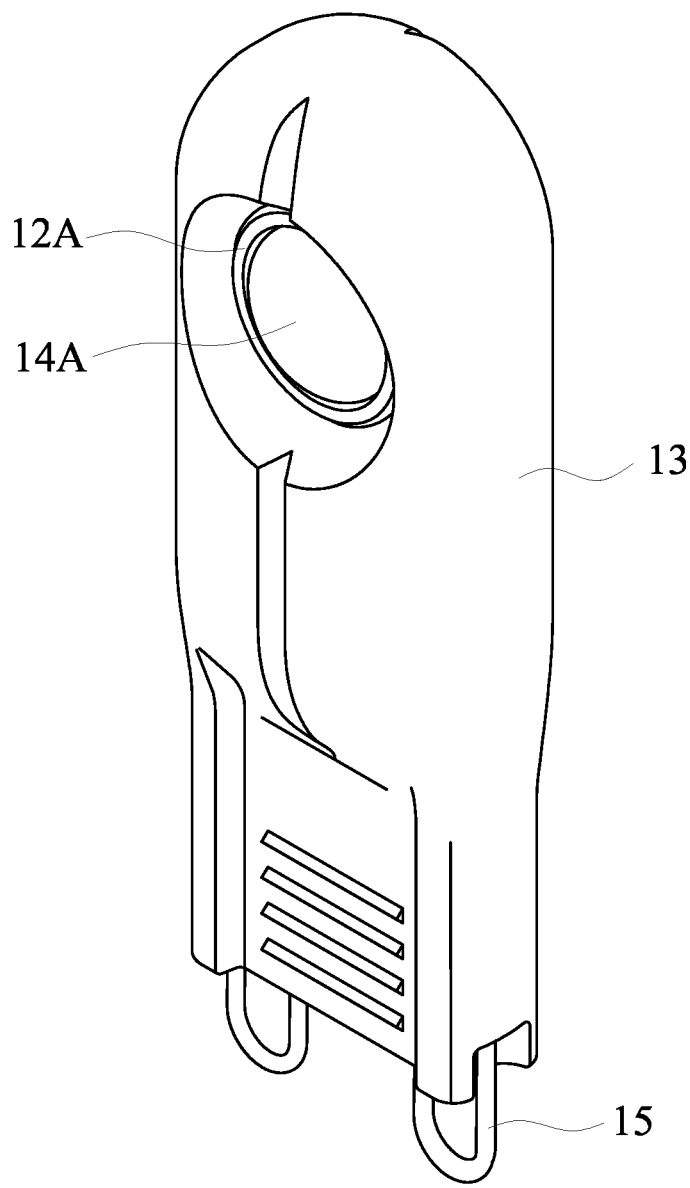
FIG. 1A shows a perspective view of a lighting apparatus in accordance with an embodiment of the present disclosure.
Figure 1B:
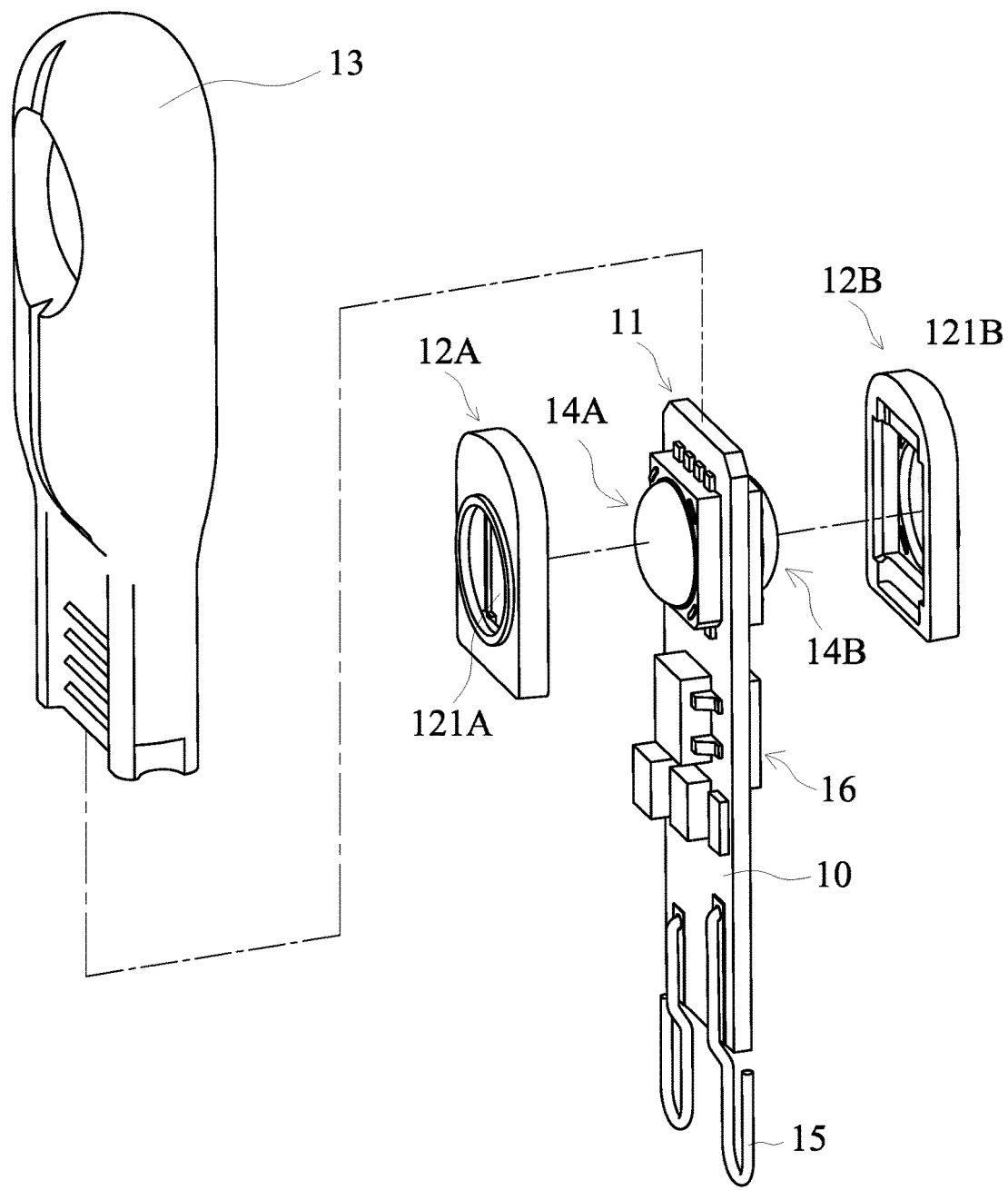
FIG. 1B shows an exploded view of a lighting apparatus in accordance with an embodiment of the present disclosure.
Figure 1C:
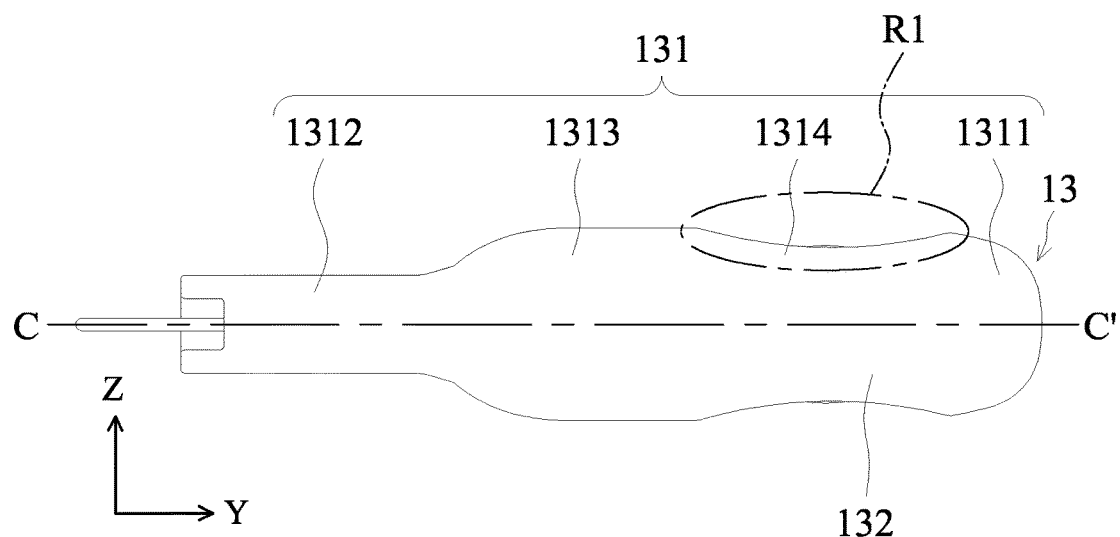
FIG. 1C shows a side view of a lighting apparatus in accordance with an embodiment of the present disclosure.
Figure 1D:
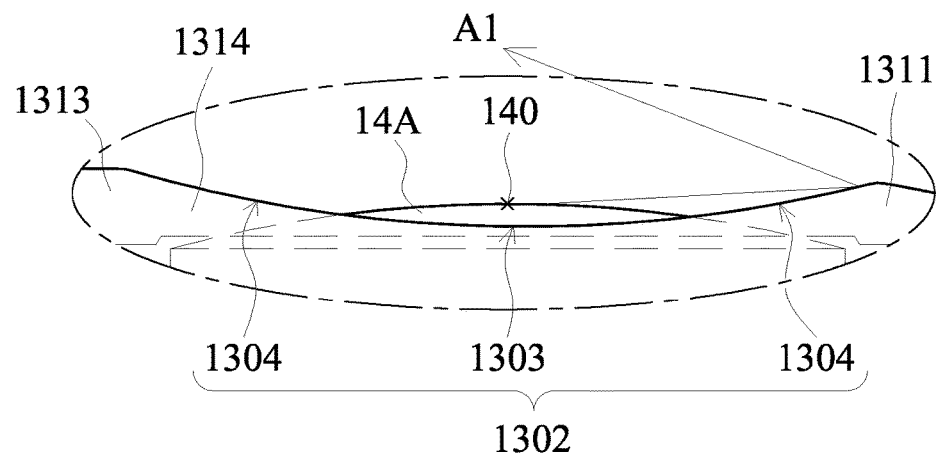
FIG. 1D shows a partially enlarged view of the lighting apparatus shown in FIG. 1C.

FIG. 1A shows a perspective view of lighting apparatus 100. FIG. 1B shows an exploded view of lighting apparatus 100 in FIG. 1A. FIG. 1C shows a side view of lighting apparatus 100 in FIG. 1A. FIG. 1D shows a partially enlarged view of R1 in FIG. 1C. Referring to FIGS. 1A and 1B, the lighting apparatus 100 is a capsulated lamp, and the lighting apparatus 100 has a lighting structure 11, two cover elements 12A and 12B, and a cover body 13. The lighting structure 11 has a carrier 10, a first light-emitting element 14A, a second light-emitting element 14B, an electrical connector 15 and a plurality of electrical elements 16. The electrical element 16, such as resistor, inductor, capacitor, diode, bridge rectifier, switch, and IC unit is formed on the carrier 10. The electrical connector 15 is also formed on the carrier 10. Each of the cover elements 12A and 12B corresponds to the hole 121A or 121B, and the holes 121A and 121B correspondingly cover the light-emitting element 14A and the light-emitting element 14B. The light-emitting elements 14A and 14B penetrate through the holes 121A and 121B, and the light-emitting elements 14A and 14B are exposed to environment (for example, air). The cover body 13 covers the carrier 10, the cover element 12A and 12B, the electrical element 16 and a part of electrical connector 15, but does not cover all of the light-emitting elements 14A and 14B. The light-emitting elements 14A and 14B exposed by the cover elements 12A and 12B are also exposed to the environment. In other words, the exposed area of the light-emitting element 14A before being covered by the cover element 12A is substantially the same as the exposed area of the light-emitting element 14A after being covered by the cover element 12A. Similarly, the exposed area of the light-emitting element 14B before being covered by the cover element 12B is substantially the same as the exposed area of the light-emitting element 14B after being covered by the cover element 12B. Besides, because the cover body 13 only covers a part of the electrical connector 15, the uncovered part of the electrical connector 15 is exposed to the environment and is electrically connected to external power source, such as a DC power source or an AC power source. The external power source can be a power generator. In the embodiment, the external power source provides a power having an RMS (root mean square) value of 100-130 volt or having an RMS value of 200-260 volt. The lighting apparatus 100 has a volume smaller than 5000 mm$^3$ and larger than 1500 mm$^3$. The volume mentioned above is the space occupied by the lighting apparatus 100.

Referring to FIGS. 1C and 1D, the lighting apparatus 100 has a central axis CC'. The cover body 13 has an upper part 131 and a lower part 132, the upper part 131 and the lower part 132 are substantially symmetric corresponding to the central axis CC'. Because the upper part 131 and the lower part 132 are symmetric with each other, for brevity, the following description are using the upper part 131, the first light-emitting element 14A and the cover element 12A as targets to describe following embodiment or embodiments. The relative position of the lower part 132, the second light-emitting element 14B, and the cover element 12B can be derived through following paragraphs without further description. The upper part 131 has a top part 1311, a bottom part 1312, a middle part 1313 formed between the top part 1311 and the bottom part 1312, and a recess 1314 formed between the top part 1311 and the middle part 1313. The largest thicknesses of the top part 1311 and the middle part 1313 are substantially the same (in the Z direction), and the largest thicknesses of the top part 1311 and the middle part 1313 are larger than that of the bottom part 1312. The cover element 12A and the first light-emitting element 14A are located in the recess 1314, and the first light-emitting element 14A does not exceed the highest part of the top part 1311 (or the middle part 1313) in the +Z direction. The recess 1314 has top surface 1302, a cross-sectional view of arch with a concave 1303, and two extension parts 1304. The two extension parts 1304 are extending upward (along +Z direction) from the concave 1303 and from the middle part 1313. The first light-emitting element 14A protrudes from the concave 1303, that is, the highest point 140 of the first light-emitting element 14A locates above the concave 1303. In this embodiment, the light emitted from the first light-emitting element 14A does not penetrate the cover body 13 because the cover body 13 is not transparent. With the configuration above, the light from the first light-emitting element 14A moving in a direction toward the extension part 1304 is reflected to a direction moving upward to leave the lighting apparatus 100.

Figure 2A:
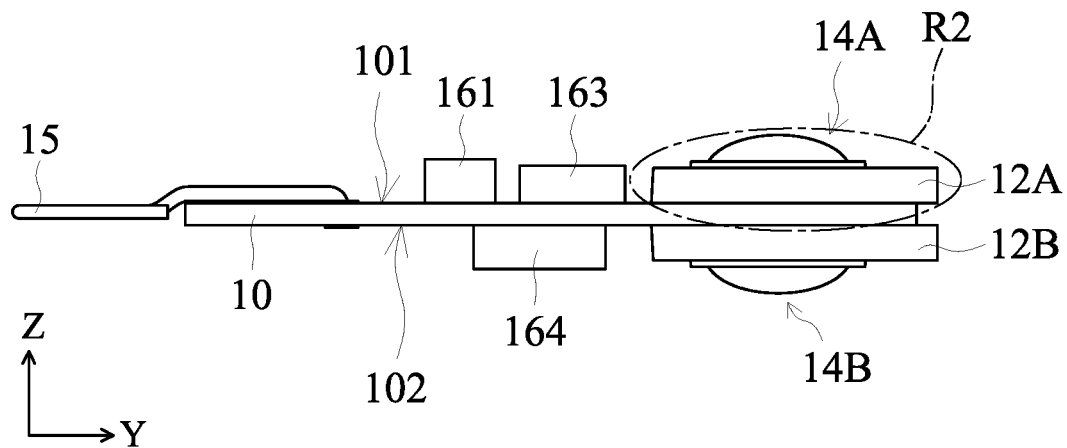
FIG. 2A shows a side view of a cover element and a lighting structure in accordance with an embodiment of the present disclosure.
Figure 2B:
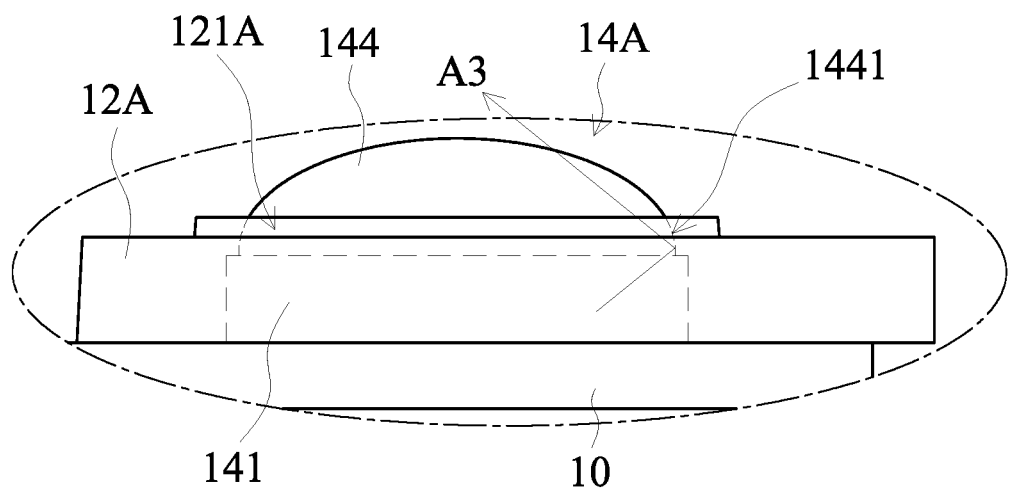
FIG. 2B shows a partially enlarged view of the lighting apparatus shown in FIG. 2A.
Figure 2C:
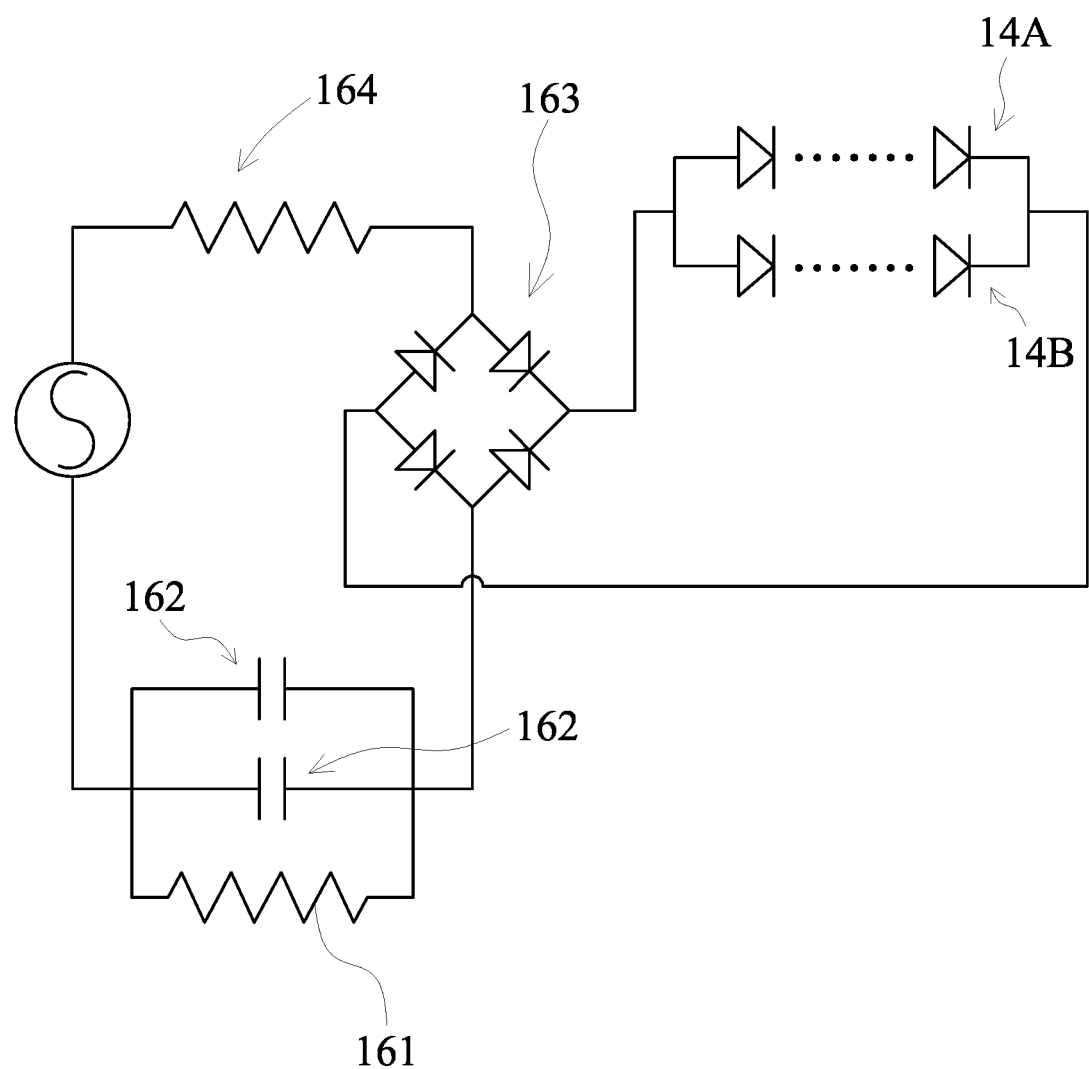
FIG. 2C shows a schematic view of a lighting structure in accordance with an embodiment of the present disclosure.

FIG. 2A shows a side view of the cover elements 12A and 12B, and a lighting structure 11 in accordance with an embodiment of the present disclosure. FIG. 2B shows a partially enlarged view of R2 in FIG. 2A. The carrier 10 has a first surface 101 and a second surface 102 opposite to the first surface 101. The first light-emitting element 14A is formed on a first position of the first surface 101, and the second light-emitting element 14B is formed on a second position of the second surface 102, wherein the second position on the second surface 102 is corresponded to the first position on the first surface 101. Preferably, the first light-emitting element 14A and the second light-emitting element 14B are partially or entirely overlapped with each other. In this embodiment, a first resistor 161, two capacitors 162, and a bridge rectifier 136 are formed on the first surface 101 (referring to FIG. 6A), and a second resistor 164 is formed on the second surface 102. The first resistor 161 has a resistance of 20~50Ω and the second resistor 164 has a resistance of 1~10 MΩ. Each of the two capacitors has a capacitance of 0.1~1 µF. The bridge rectifier 163 has four light-emitting diodes or four diodes not emitting light. FIG. 2C shows a schematic view of the lighting apparatus 100. The first light-emitting element 14A and the second light-emitting element 14B are connected in parallel. Besides, the apparatus in the embodiment is driven by a RC circuit. In another embodiment, the apparatus is driven by a linear circuit or a switch circuit.

In this embodiment, only one light-emitting element 14A is formed on the first surface 101 and only one light-emitting element 14B is formed on the second surface 102 of the carrier 10. In another embodiment, multiple light-emitting elements of same or different characteristic(s) are formed on the first surface 101 and/or on the second surface 102. The characteristics comprise size, color, light-emitting angle, CRI, etc. The core layer of the carrier 10 comprises metal, thermoplastic material, thermosetting material, or ceramic material. The metal can be a single layer or a stack of aluminum, copper, gold, silver or an alloy thereof. The thermoplastic material comprises phonetic, epoxy, Bismaleimide Triazine, Epoxy Molding Compound (EMC), Silicone Molding Compound (SMC) or the combination thereof. The thermosetting material comprises polyimide resin, polytetrafluorethylene, and so on. The ceramic material comprises aluminum oxide, aluminum nitride, aluminum silicon carbide, and so on.

Figure 3A:
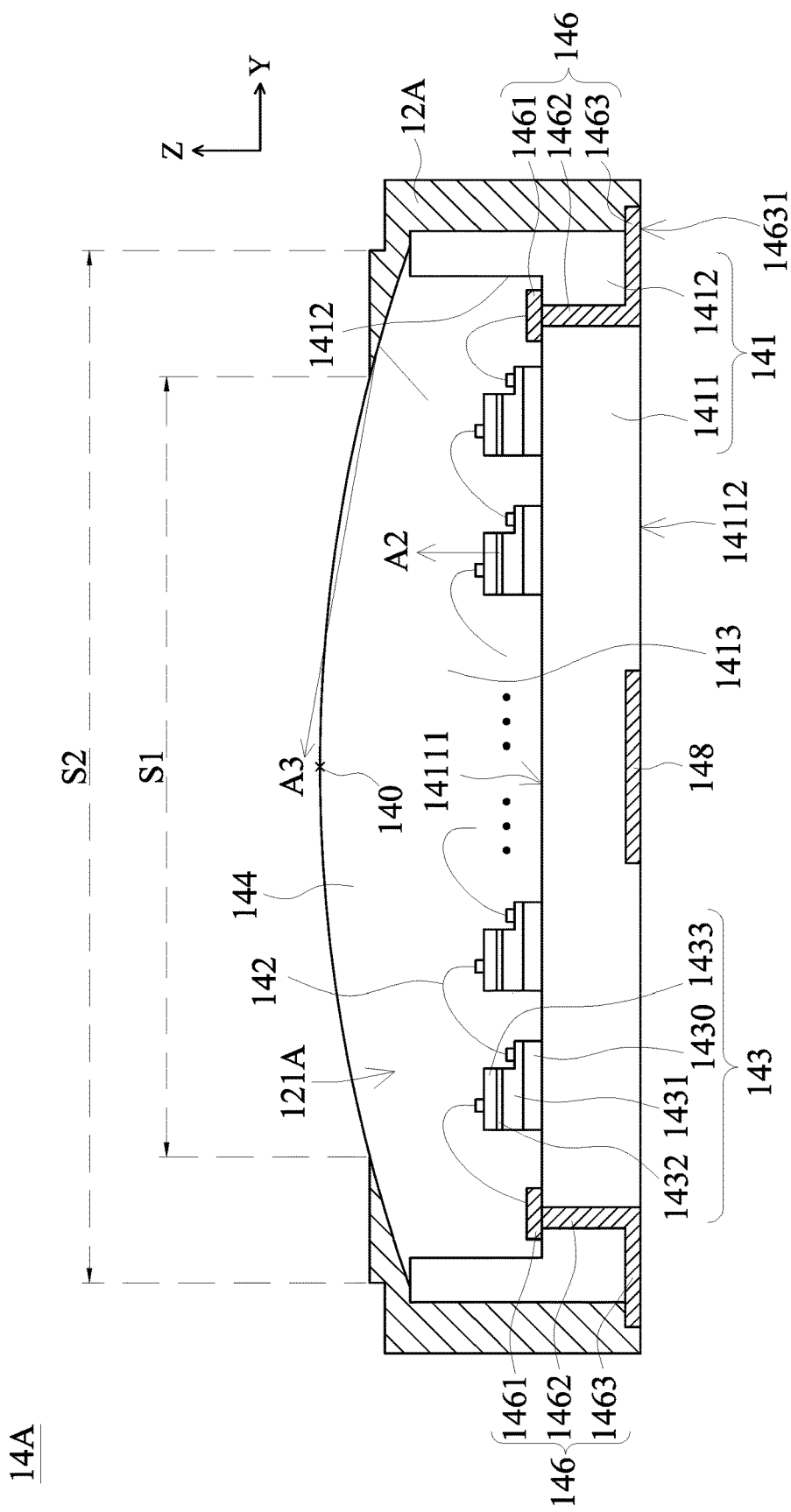
FIG. 3A shows a cross-sectional view of a cover element and a light emitting element in accordance with an embodiment of the present disclosure.
Figure 3B:
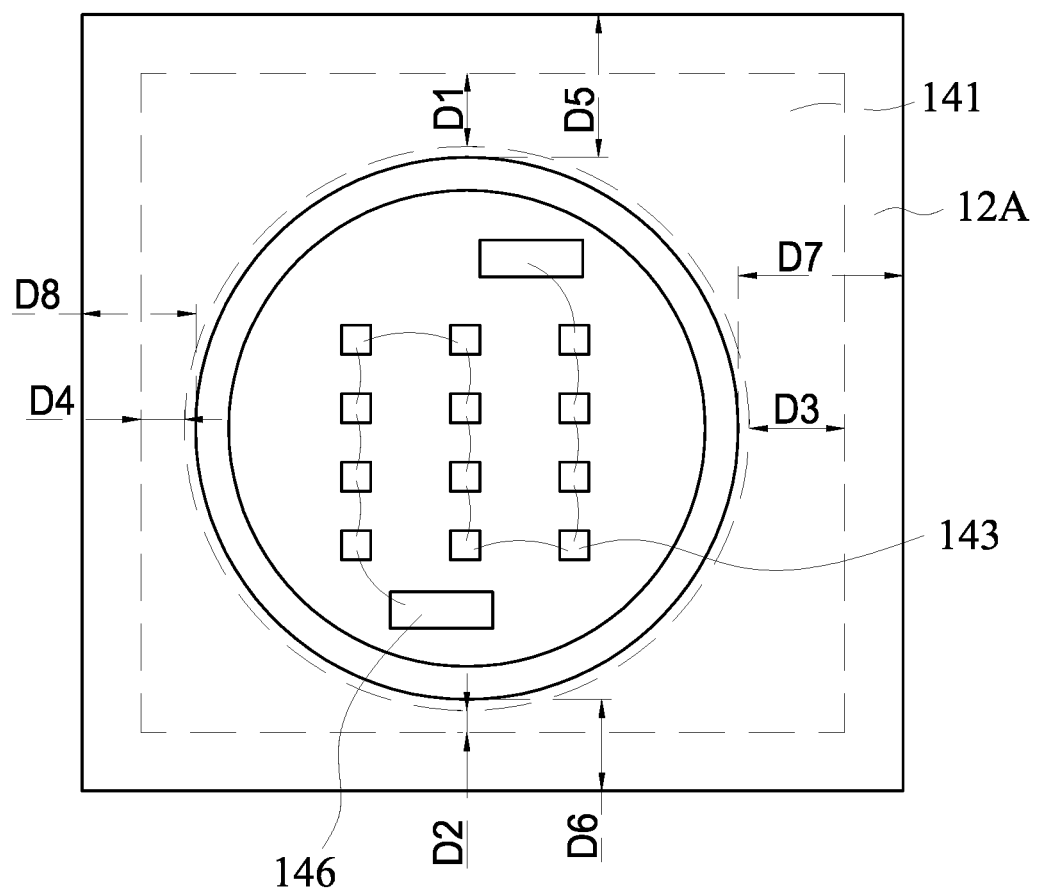
FIG. 3B shows a top view of FIG. 3A.

FIG. 3A shows a cross-sectional view of a light-emitting element 14A and a cover element 12A in accordance with an embodiment of the present disclosure. FIG. 3B shows a top view of FIG. 3A. The structures or specifications of the first light-emitting element 14A and the second light-emitting element 14B can be the same or different. Referring to FIG. 3A, the first light-emitting element 14A has a support body 141, a circuit structure 142, multiple light-emitting units 143, and a filler 144. The support body 141 has a bottom part 1411 and a side part 1412 to form an inner space 1413. The multiple light-emitting units 143 are fixed to the bottom part 1411 and located within the inner space 1413. The filler 144 is filled in the inner space 1413 to fully cover the light-emitting units 143 and formed on the support body 141. In this embodiment, the circuit structure 142 is a wire electrically connected to the light-emitting units 143. The first light-emitting element 14A further comprises a conductive structure 146. The conductive structure 146 has a first portion 1461 formed on the bottom part 1411 and located within the inner space 1413, a conductive hole 1462 extending from the top surface 14111 of the bottom part 1411 to the bottom surface 14112 of the bottom part 1411, and a second portion 1463 formed within the bottom part 1411 to be electrically connected with the first portion 1461 through the conductive hole 1462. The second portion 1463 extends from the conductive hole 1462 to side edges (along Y direction) and protruded from the side part 1412 and has a surface 14631 to be substantially coplanar with the bottom surface 14112 of the bottom part 1411. Besides, a heat dissipating portion 148 is formed within the bottom part 1411 and the heat dissipating portion 148 is not electrically connected to the light-emitting unit 143. The heat generated from the light-emitting units 143 can be dissipated by the heat dissipating portion 148 to the environment through the carrier 10. The metal material of the conductive structure 146 can be the same as the metal material of the heat dissipating portion 148. The conductive structure 146 and the heat dissipating portion 148 can be made of a material of gold, silver, copper, chromium, aluminum, platinum, nickel, titanium, tin, an alloy thereof or a stack thereof.

In another embodiment, the light-emitting unit can be flip-chip type light-emitting unit, and the circuit structure is formed on the carrier. The light-emitting units can be fixed to the circuit structure on the carrier through a solder and the units can be electrically connected to each other through the circuit structure.

Referring to FIG. 3A, the filler 144 protrudes upward or outward (along Z axis) and has an arc cross-section. The highest point 140 of the first light-emitting element 14A locates on the filler 144. The filler 144 comprises epoxy, silicon, polyalkylene polyamide, benzocyclobutene, perfluoro cyclobutane, Su8, acrylic resin, polymethyl methacrylate, polyethylene terephthalate, polycarbonate or polyetherimide. Alternatively, the filler comprises phosphor particles and/or diffusing particles. The phosphor particles have a particle size of 5 μm~100 μm and include one or more than two kinds of phosphor materials. The phosphor material includes, but is not limited to, yellow-greenish phosphor and red phosphor. The yellow-greenish phosphor comprises aluminum oxide (such as YAG or TAG), silicate, vanadate, alkaline-earth metal selenide, or metal nitride. The red phosphor includes fluoride ($K_2TiF_6:Mn^{4+}$, $K_2SiF_6:Mn^{4+}$) silicate, vanadate, alkaline-earth metal sulfide, metal nitride oxide, a mixture of tungstate and molybdate. The weight percentage (w/w) of the phosphor within the filler is between 50%~70%. The phosphor can absorb a first light emitted from the light-emitting unit 143 and convert the first light to a second light with a spectrum different from that of the first light. The first light is mixed with the second light to produce a third light, such as a white light. The lighting apparatus has a white color temperature of 2200K~6500K (ex. 2200K, 2400K, 2700K, 3000K, 5700K, 6500K) under a stable state with a color point (CIE x, y) within a seven-step MacAdam ellipse and with a color rendering index (CRI) greater than 80 or 90. The diffusing particles can be titania, zirconia, zinc oxide or alumina to scatter light from light-emitting unit 143. The weight percentage (w/w) of the diffusing particles within the filler is between 0.1%~0.5% and has a particle size between 10 nm~100 nm or between 10 μm~50 μm. In an embodiment, the weight percentage of the diffusing particles (or phosphor particles) within a filler can be measured by a thermogravimetric analyzer (TGA). In brief, the filler is removed (through evaporation or pyrolysis) by increasing the temperature to a specific temperature so the diffusing particles (or phosphor particles) are remained. The change of the weight can be measured and the weight of the filler and the weight of the diffusing particles (or phosphor particles) can be respectively derived from the change of the weight, and the weight percentage of the diffusing particles (or phosphor particles) within the filler can be calculated. Or, the total weight of the filler and the diffusing particles (or phosphor particles) can be measured first, and a solvent is applied to remove the filler so the weight of the diffusing particles (or phosphor particles) can be measured. Then, the weight percentage of the diffusing particles (or phosphor particles) within a filler can be calculated.

The light-emitting units 143 can be connected with each other in series, in parallel, in serial-parallel, in parallel-serial or in bridge type. Each of the light-emitting units 143 comprises one substrate 1430 (can be omitted), a first type semiconductor layer 1431, an active layer 1432, and a second type semiconductor layer 1433. The first-type semiconductor layer 1431 and the second-type semiconductor layer 1433, such as a cladding layer or a confinement layer, provide electrons and holes respectively such that electrons and holes can be combined in the active layer 1432 to emit light. The first-type semiconductor layer 1431, the active layer 1432, and the second-type semiconductor layer 1433 can include III-V group semiconductor material, such as $Al_xIn_yGa_{(1-x-y)}N$ or $Al_xIn_yGa_{(1-x-y)}P$, wherein 0≤x, y≤1, and (x+y)≤1. According to the material of the active layer 1432, the light-emitting unit 143 can emit a red light with a peak wavelength or a dominate wavelength between 610~650 nm, can emit a green light with a peak wavelength or dominate wavelength between 530~570 nm, or emit a blue light with a peak wavelength or dominate wavelength between 450~490 nm. The major lighting direction (as shown as the arrow A2 in the figure) of the light-emitting unit 143 is perpendicular to the substrate 1430.

Referring to FIGS. 2B and 3A, the cover element 12A surrounds the first light-emitting element 14A. The size of the hole 121A closest to outer environment (for example, diameter $S_1$ or area) can be smaller than the size of the filler 144 (for example, diameter $S_1$ or area) to support the first light-emitting element 14A so all of the first light-emitting elements 14A or the elements inside has better impact resistance. In another aspect, the largest thickness (along Z direction) of cover element 12A is larger than the largest thickness of the support body 141 but smaller than the largest thickness of the filler 144. When the cover element 12A is formed on the first light-emitting element 14A, part of the side wall 1441 of the filler 144 is covered so the light from the first light-emitting element 14A moving toward the side wall 1441 (referring to the arrow A3 shown in the figure) of the filler 144 is absorbed by the cover element 12A or reflected toward the filler 144 away from the first light-emitting element 14A. In another embodiment, the size of the hole 121A of the cover element 12 can be equal to or larger than the size of the filler 144.

Referring to FIG. 3B, the support body 141 is substantially a rectangular with four sides (rectangular dashed lines). The support body 141 can include a reflective material, and the reflective material can be epoxy molding compound (EMC) or silicone molding compound (SMC). The size of the support body 141 in top view can be 7.0 mm*9.0 mm, 5.6 mm*3.0 mm or 2.8 mm*3.5 mm. The filler 144 in top view is substantially a circle. The shortest distance D1, D2, D3 and D4 between the filler 144 and the four edges of the support body 141 are listed as following: 0 mm≤D1<1 mm, 0 mm≤D2<1 mm, 0.1 mm≤D3<1 mm and 0.1 mm≤D4<1 mm. The cover element 12A is substantially a rectangular. As shown in FIGS. 3A and 3B, the cover element 12A has a ladder structure and has a size or 1 mm≤D5<2 mm, 1 mm≤D6<2 mm, 1 mm≤D7<3 mm, and 1 mm≤D8<3 mm. The function of the cover element 12A is described in the following paragraphs.

Figure 4A:
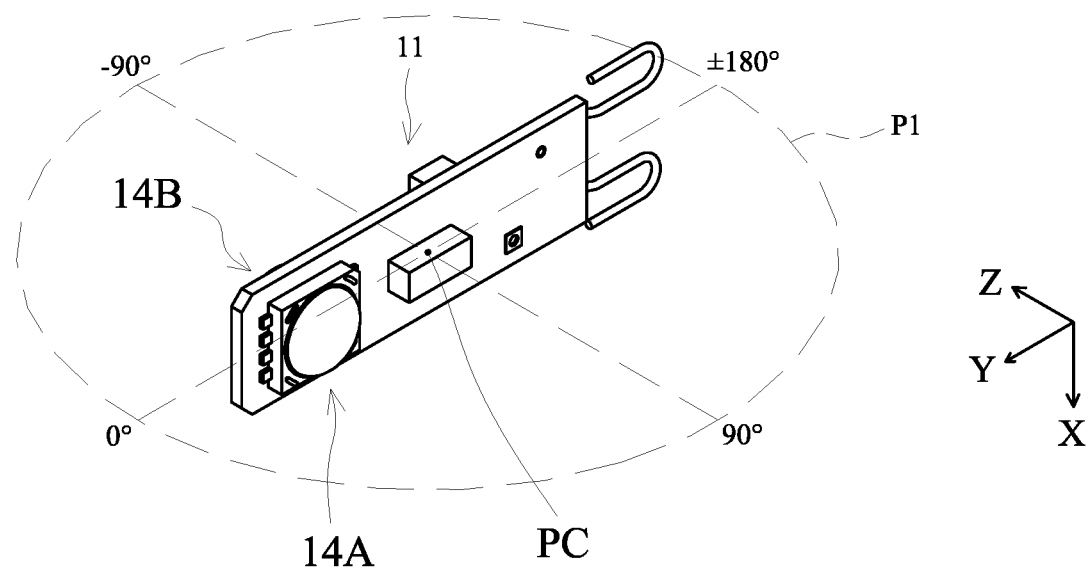
FIG. 4A shows a drawing of measuring a lighting structure in accordance with an embodiment of the present disclosure.
Figure 4A:
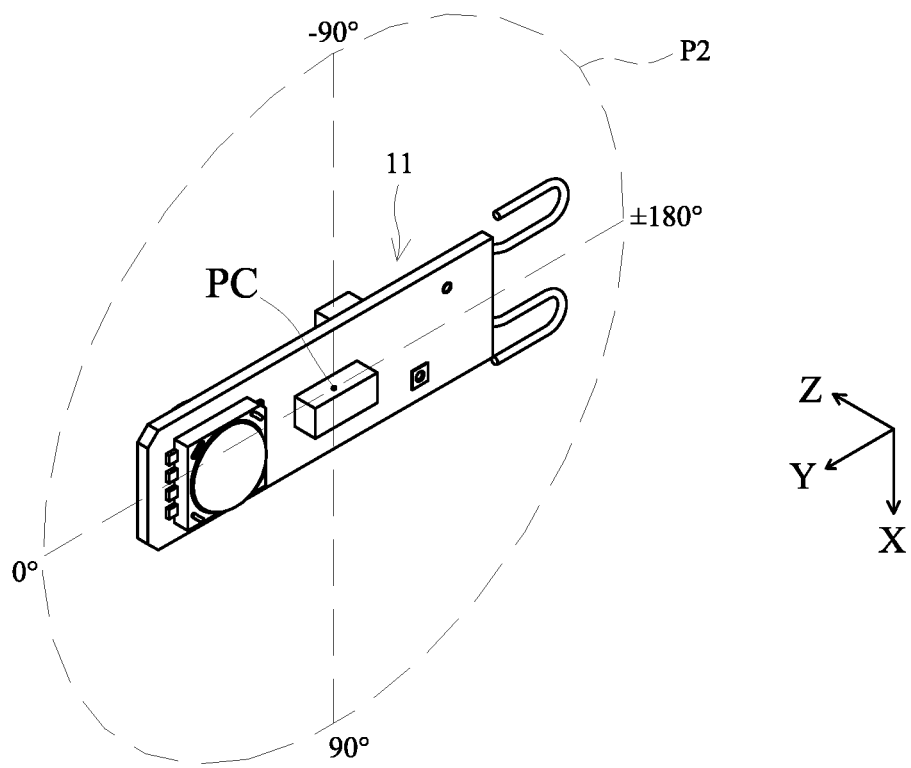

FIG. 4A shows a diagram of measuring lighting structure 11. In the embodiment, when the lighting structure 11 emits light, a goniophotometer (for example, the product numbered LID-100CS from AMA Optoelectronics. Inc.) is used to measure the luminous intensity of every points on the circle P1 or the circle P2, wherein the circle P1 and P2 are virtual and are defined for measurement. The carrier 10 of the lighting structure 11 has a top surface where the light-emitting element 14A is formed on. The top surface forms the XY plane containing the X axis and Y axis, and the filler 144 of the light-emitting element 14A/14B protrudes along Z axis. The circle P1 locates on the YZ plane containing Y axis and Z axis and the circle P2 locates on the XY plane.

As FIG. 4A shows, the 0 degree, +180 degree and −180 degree are located on the Y axis; the +90 degree and −90 degree of circle P1 are located on the Z axis, and the +90 degree and −90 degree of circle P2 are located on the X axis. In the embodiment, the point of 0 degree locates on a side nearer to the light-emitting element 14A, and the point of +180 degree and −180 degree locate on the other side of the lighting structure 11 opposite to the 0 degree.

The top surface of the carrier 10 intersects with circle P1 and the circle P2 is parallel to the top surface. The luminous intensity of each point on circle P1 or circle P2 is measured with an angle defined by the included angle between a first line and a second line, wherein the first line connects one measuring point on circle P1 or circle P2 and a center point PC of the carrier 10, and the second line is a main axis (Y axis, for example) passing the center point of the carrier 10 and is defined as 0 degree. The center point of carrier 10 is the geometric center of the carrier 10. The center of the circle P1 and the center of circle P2 are positioned at the center point PC.

The lighting structure 11 has a first luminous intensity distributed on a plane parallel to the top surface, for example, circle P1, and a second luminous intensity distributed on a plane intersecting with the top surface, for example, circle P2. In other words, the luminous intensity is measured around the lighting structure 11 at a surface parallel to the top surface or at a surface intersecting with the top surface by any angle. In this embodiment, the intensities are measured at a surface perpendicular to the top surface and a surface parallel to the top surface. Similarly, the top surface used to define the circle can be substitute by a bottom surface where the light-emitting element 14B is formed on. In another embodiment, the circle can be an ellipse.

Figure 4B:
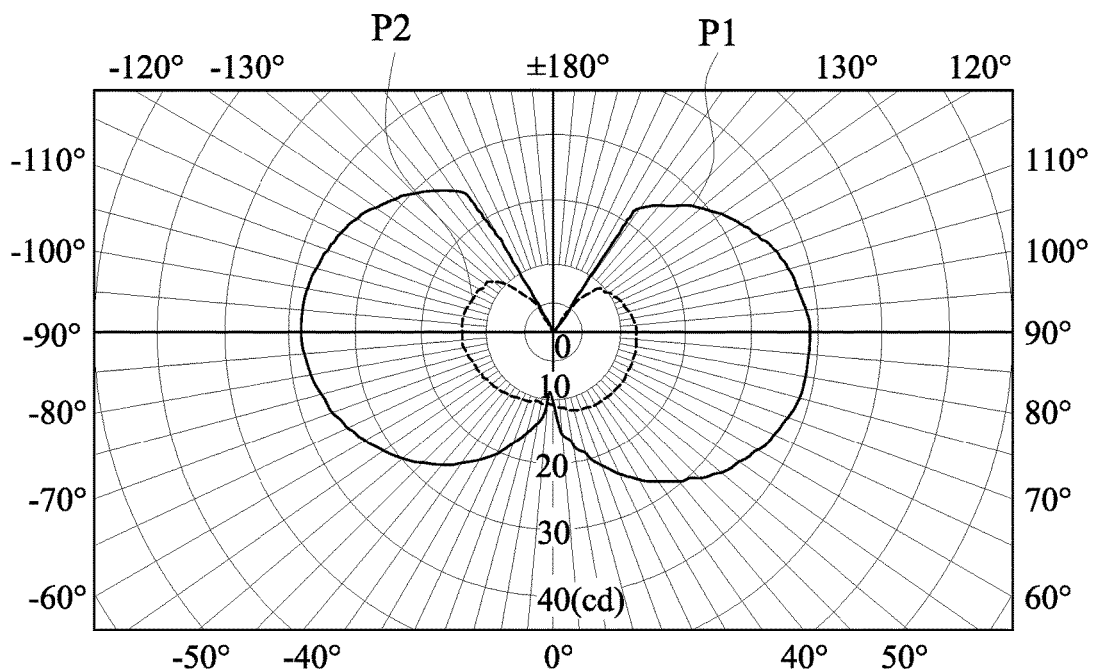
FIG. 4B shows a luminous intensity distribution curves measured from a lighting structure in accordance with an embodiment of the present disclosure.
Figure 4C:
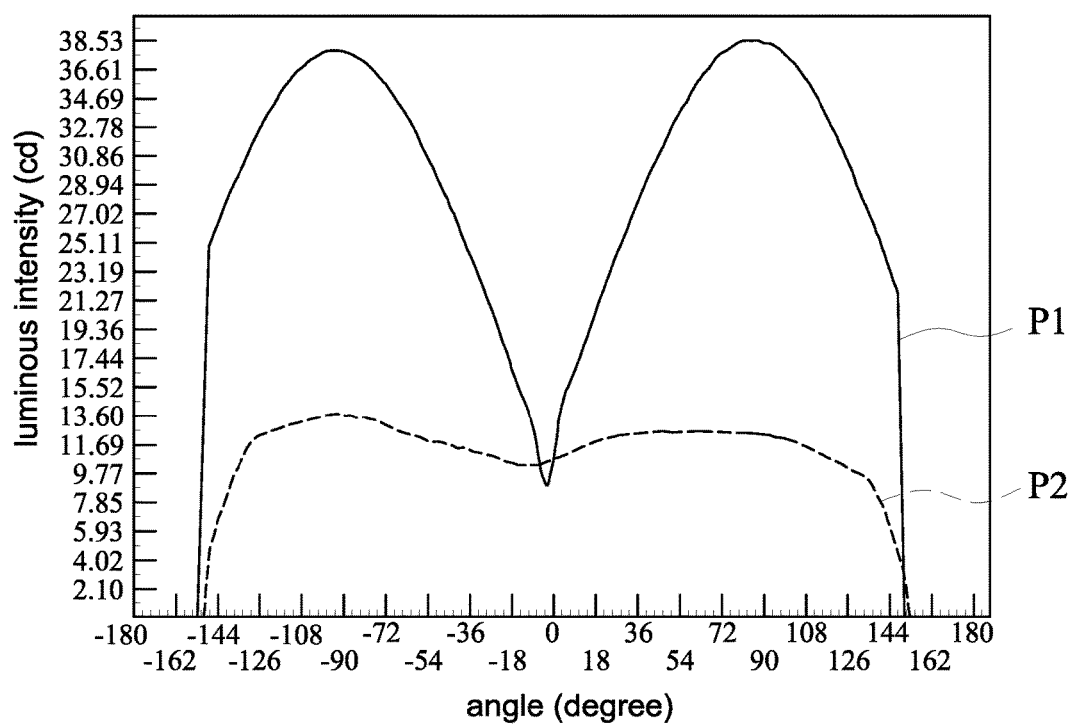
FIG. 4C shows a relationship curve between the luminous intensity and angle measured from a lighting structure in accordance with an embodiment of the present disclosure.

The circle P1 is substantially perpendicular to the circle P2. Furthermore, the angles and the luminous intensities measured at points on the circle are used to form a graph of luminous intensity distribution curves. The measured results are then shown as figures below. FIG. 4B shows a luminous intensity distribution curves measured while the light-emitting structure 11 emits light. FIG. 4C shows the relationship curve between luminous intensity and angle to derive the light-emitting angle. As shown in FIG. 4B, the solid lines represent the luminous intensity distribution curves of points on the circle P1 of the light-emitting structure 11 in FIG. 4A, and the dashed lines represent the luminous intensity distribution curves of points on the circle P2 of the light-emitting structure 11 in FIG. 4A.

As the solid lines shown in FIG. 4B, the light-emitting structure 11 has a maximum luminous intensity of 38.3 cd measured at about 90 degree of the circle P1, and a luminous intensity of 10.6 cd measured at 0 degree of the circle P1. The luminous intensity is increased when the angle changes from 0 degree to 90 degree of the circle P1, and the luminous intensity is decreased when the angle changes from 90 degree to 150 degree of the circle P1. The luminous intensity measured from 150 degree to 180 degree of the circle P1 is almost zero, and the luminous intensity distribution curve measured between 0 degree to −180 degree of the circle P1 is basically the same as that measured between 0 degree to 180 degree of the circle P1. Besides, the luminous intensity distribution measured between 0 degree to 180 degree of the circle P1 is substantially symmetrical to that measured between 0 degree to −180 degree of the circle P1 with respect to the axis of 0 degree and 180 degree as shown in FIG. 4B. The light-emitting structure has a light-emitting angle of 301 degree at circle P1.

As the dashed lines shown in FIG. 4B, the light-emitting structure 11 has a maximum luminous intensity of 13.6 cd measured at about −95 degree of the circle P2, and a luminous intensity of 10.65 cd measured at 0 degree of the circle P2. The luminous intensity is increased when the angle changes from 0 degree to 57.5 degree of the circle P2, and the luminous intensity measured is decreased when the angle changes from 57.5 degree to 150 degree of the circle P2. The luminous intensity from 150 degree to 180 degree is almost zero. The luminous intensity is decreased between 0 degree to −95 degree of the circle P2, and the luminous intensity is increased between −90 degree to 150 degree of the circle P2. The luminous intensity measured from −150 degree to −180 degree of the circle P2 is almost zero as shown in FIG. 4B. The light-emitting structure has a light-emitting angle of 291 degree at circle P2.

The light-emitting angle is defined as a range of angle from the angle of maximum luminous intensity to the angle of half (50%) of the maximum luminous intensity. For example, FIG. 4C shows a relationship curve between luminous intensity and angle in a Cartesian coordinate system (x coordinate represents angle; y coordinate represents luminous intensity) transformed from the luminous intensity distribution curve (polar diagram) measured from the circle P1. As shown in the figure, the maximum luminous intensity is about 38.3 cd and the value of 50% the maximum luminous intensity is about 19.15 cd. A line is plotted at the value of 19.15 cd in the y coordinate to intersect with the curve at two points (two intersections) on the luminous intensity distribution curve. The angular range between the two points is calculated to obtain the light-emitting angle. When the line is intersected with the curve at more than two points (> two intersections), the angular range between the two points far away from each other is calculated to obtain the light-emitting angle. Similarly, a relationship curve between luminous intensity and angle in a Cartesian coordinate system (x coordinate represents angle; y coordinate represents luminous intensity) can be transformed from the luminous intensity distribution curve (polar diagram) obtained by measuring the circle P2 to calculate the light-emitting angle. In addition, in this embodiment, it shows only the luminous intensity distribution curves obtained by measuring the circle P1 and circle P2 of the light-emitting structure 11, and the luminous intensity of different circles (along different directions) can also be measured to obtain the luminous intensity distribution curves depending on different requirements. Moreover, each circle has an emitting angle.

Compared with the solid lines (corresponded to circle P1) and dashed lines (corresponded to circle P2), since the major lighting direction of the light-emitting unit 143 is in the Z direction (referring to FIG. 3A), the average luminous intensity measured from circle P2 is less than that measured from circle P1.

Figure 5A:
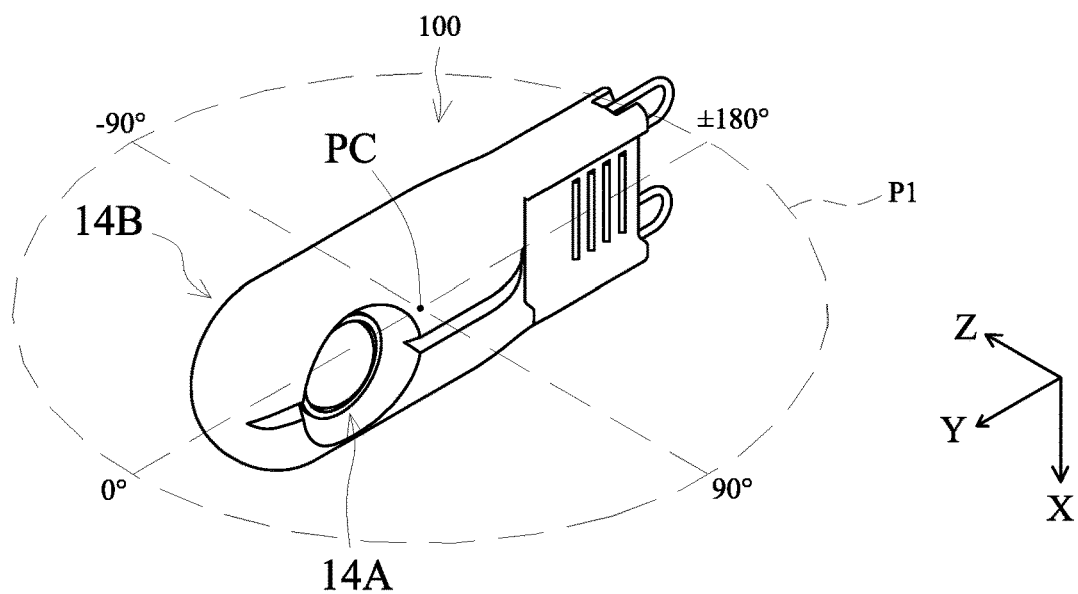
FIG. 5A shows a diagram of measuring a lighting apparatus in accordance with an embodiment of the present disclosure.
Figure 5A:
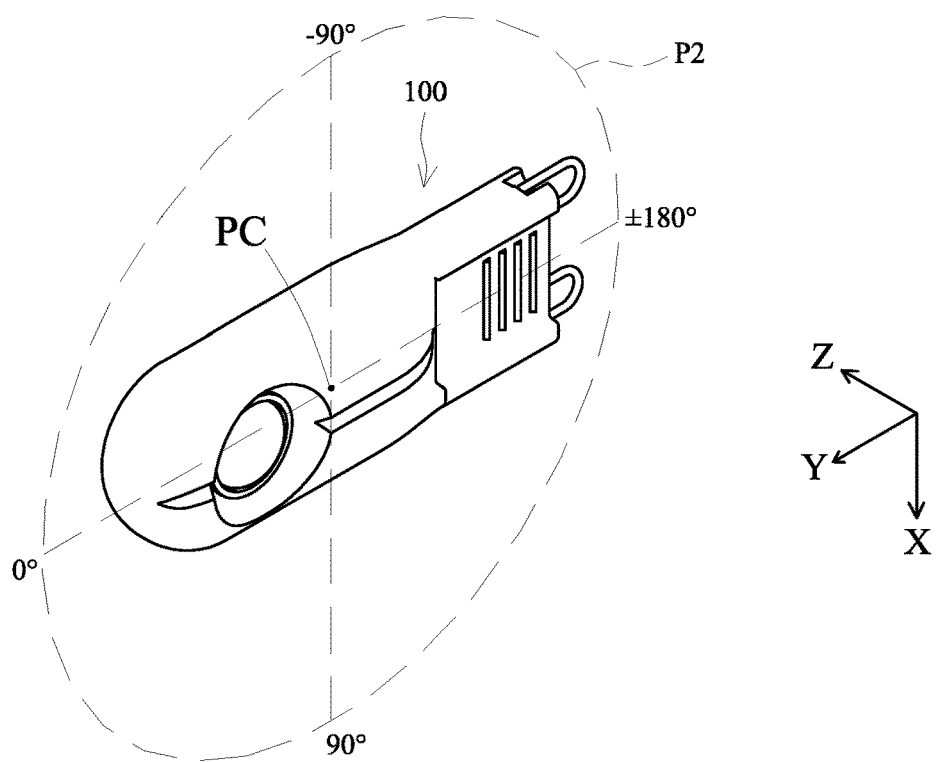

FIG. 5A shows a drawing of a setting of measuring the lighting apparatus 100. A goniophotometer (product numbered LID-100CS from AMA Optoelectronics. Inc.) is used to measure the luminous intensities of each points on circle P1 or P2 while the lighting apparatus 100 emits light, wherein the circles P1 and P2 are virtual and are defined for measurement. Similarly with FIG. 4A, the lighting apparatus 100 has a surface where the light-emitting element 14A is formed on. The surface is forms the XY plane containing X axis and Y axis, and the filler 144 of the light-emitting element 14A/14B protrudes along Z axis. The circle P1 locates on the YZ plane containing Y axis and Z axis and the circle P2 locates on the XY plane. In the embodiment, the 0 degree, +180 degree and −180 degree are located on the Y axis; the +90 degree and −90 degree of circle P1 are located on the Z axis, and the +90 degree and −90 degree of circle P2 are located on the X axis.

The luminous intensity of each point on circle P1 or circle P2 is measured with an angle defined by the included angle between a first line and a second line, wherein the first line connects one measuring point on circle P1 or circle P2 and a center point PC of the carrier 10 (in the lighting apparatus 100), and the second line is a main axis (Y axis, for example) passing the center point of the carrier 10 and is defined as 0 degree. The center point of carrier 10 is the geometric center of the carrier 10. The center of the circle P1 and the center of circle P2 are positioned at the center point PC.

Figure 5B:
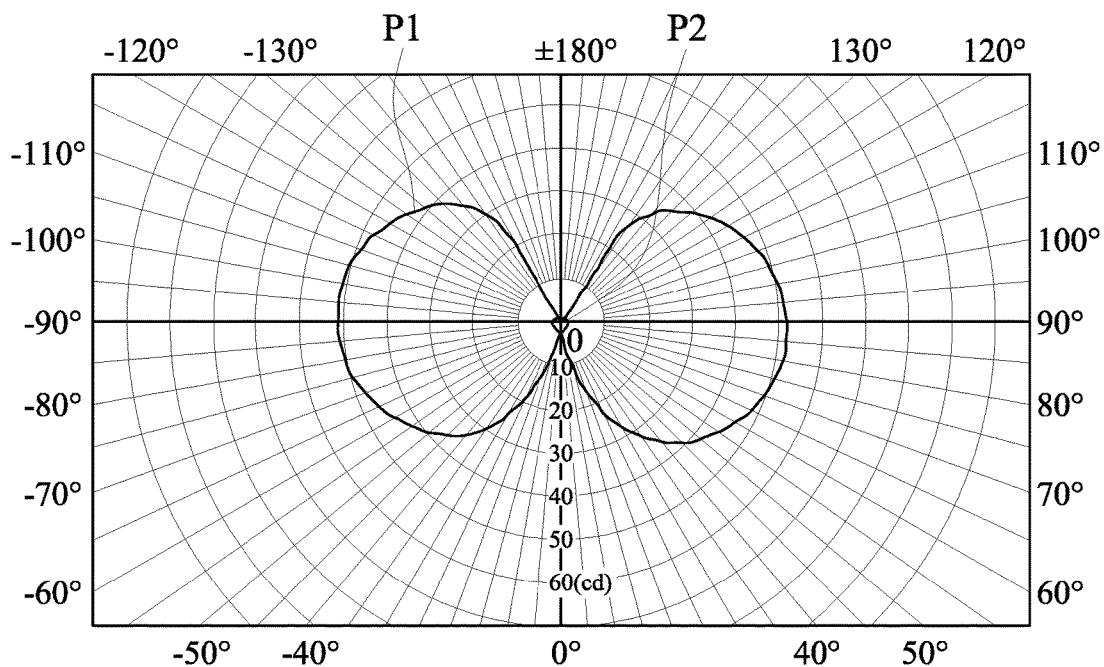
FIG. 5B shows a luminous intensity distribution curves measured from a lighting apparatus in accordance with an embodiment of the present disclosure.
Figure 5C:
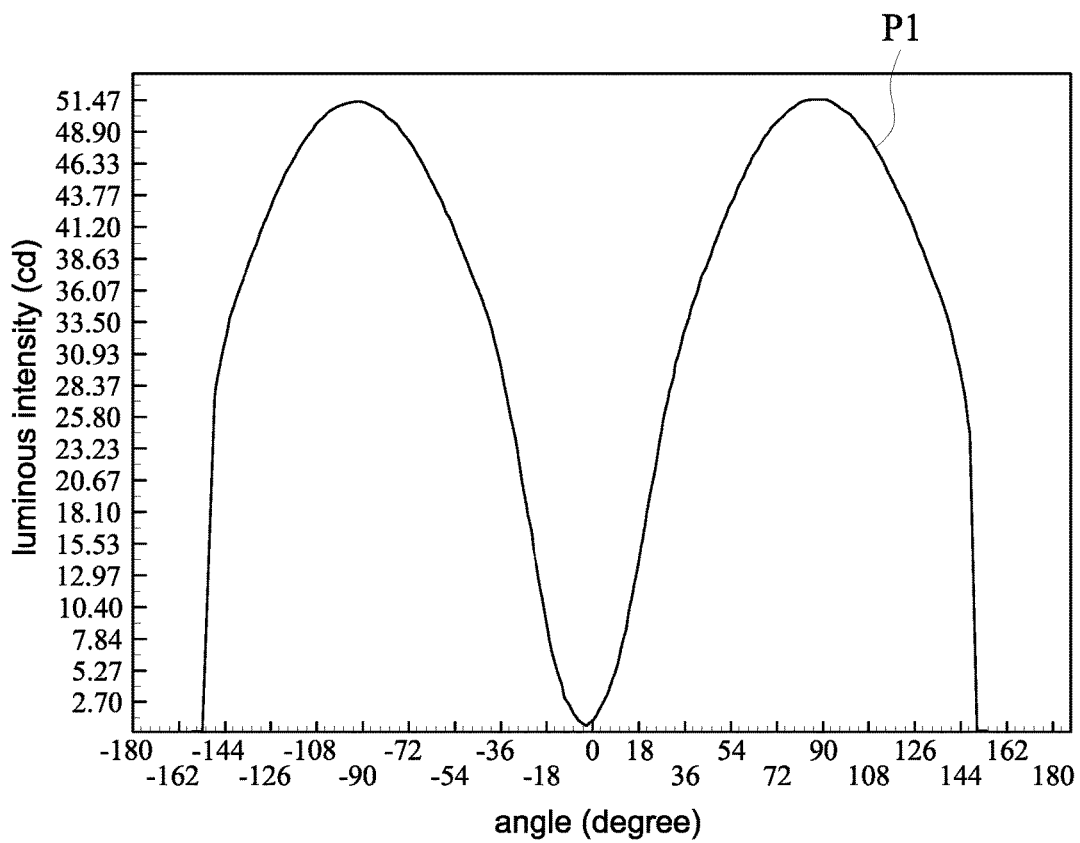
FIG. 5C shows a relationship curve between the luminous intensity and angle measured from a lighting apparatus in accordance with an embodiment of the present disclosure.

FIG. 5B shows a drawing of luminous intensity distribution curve while the lighting apparatus 100 emits light. FIG. 5C shows the relationship curve between luminous intensity and angle to derive the light-emitting angle. The light-emitting element 14A is formed on a top surface of the carrier 10, the circle P1 is intersect with the top surface and the circle P2 is parallel to the top surface. The lighting apparatus 100 has a first luminous intensity distributed on a surface parallel to the top surface and a second luminous intensity distributed on a surface intersecting with the top surface. In other words, the luminous intensity is measured around the lighting apparatus 100 at a surface parallel to the top surface and at a surface intersecting with the top surface by any angle. In this embodiment, the intensities are measured at a surface perpendicular to the top surface and a surface parallel to the top surface. Similarly, the top surface used to define the circle can be substitute by a bottom surface where the light-emitting element 14B is formed on. In another embodiment, the circle can be an ellipse.

The solid lines corresponded to the circle P1 shows a drawing of luminous intensity distribution curve of circle P1 of the lighting apparatus, and dashed lines corresponded to the circle P2 show a drawing of luminous intensity distribution curve of circle P2 of the lighting apparatus.

As the solid line shown in FIG. 5B, the lighting apparatus 100 has a maximum luminous intensity of 51.47 cd measured at about 90 degree of the circle P1, and a luminous intensity of 1.12 cd measured at 0 degree of the circle P1. The luminous intensity is increased when the angle changes from 0 degree to 90 degree of the circle P1, and the luminous intensity is decreased when the angle changes from 90 degree to 150 degree of the circle P1. The luminous intensity measured from 150 degree to 180 degree of the circle P1 is almost zero, and the luminous intensity distribution curve measured between 0 degree to −180 degree of the circle P1 is basically the same as that measured between 0 degree to 180 degree of the circle P1. Besides, the luminous intensity distribution measured between 0 degree to 180 degree of the circle P1 is substantially symmetrical to that between 0 degree to −180 degree of the circle P1 with respect to the axis of 0 degree and 180 degree of the circle P1 as shown in FIG. 5B. The lighting apparatus 100 has a light-emitting angle of 301 degree at circle P1.

As the dashed lines shown in FIG. 4B, the lighting apparatus 100 has a maximum luminous intensity of 1.36 cd measured at about −75 degree of the circle P2, and a luminous intensity of 1.2 cd measured at 0 degree of the circle P2. As shown in the figure, the luminous intensity is between 0~2 cd between 0 degree to 180 degree of the circle P2 and between 0 degree to −180 degree of the circle P2.

As the calculation method of light-emitting angle shown above, referring to FIG. 5C, the luminous intensity distribution curve in polar system measured from circle P1 of FIG. 5B can be transformed to Cartesian coordinate system to calculate the light-emitting angle of circle P1.

The luminous intensity of the lighting structure 11 (or lighting apparatus 100) increases with the increase of the input current (or operating power) so the maximum luminous intensity (candela) is increased. Thus, the luminous intensity of the lighting structure 11 (or lighting apparatus 100) under different operating current can be different, but the drawings of luminous intensity distribution curve are substantially the same or similar.

FIG. 4B shows a drawing of luminous intensity distribution curve without cover body 13 or cover elements 12A and 12B. FIG. 5B shows a drawing of luminous intensity distribution curve with cover body 13 and cover elements 12A and 12B. Compared with the drawing of luminous intensity distribution curve of circle P1 in FIGS. 4B and 5B, the light emitted from the light-emitting elements 14A and 14B heading to the side surface (along the direction of 0 degree) is not reflected or shield by other objects (in this embodiment, the objects are cover body 13 and cover elements 12A and 12B), so a luminous of 10.65 cd is measured at 0 degree. On the contrary, referring to the structure in FIG. 5A, the light heading to the side surface (along the direction of 0 degree) is absorbed or reflected by the cover elements 12A and 12B or the cover body 13 to move in a direction toward 90 degree. So, the luminous at 0 degree of the circle P1 is only 1.12 cd as shown in FIG. 5B and that at 90 degree of the circle P1 is 51.47 cd (luminous at 90 degree is 38.3 cd) as shown in FIG. 5B.

Furthermore, to compare the drawings of luminous intensity distribution curves of circle P2 in FIGS. 4B and 5B. As mentioned above, because almost all of the light (more than 98% of total amount of the light) from the light-emitting elements 14A and 14B is absorbed or reflected by the cover body 13, the luminous intensity of all angles are about 1~2 cd as shown in the drawing of luminous intensity distribution curve in FIG. 5B. On the contrary, the luminous intensity at 0 degree of the circle P2 is 10.65 cd as shown in FIG. 5B, and the largest luminous intensity is 13.6 cd as shown in FIG. 5B.

According to above paragraphs, a first luminous intensity is measured at a first angle (such as 0 degree of circle P2) when a first structure (such as the lighting structure 11) is provided to emit a light, a second luminous intensity is measured at the first angle (the same as 0 degree of circle P2) when a second structure (such as the lighting apparatus 100) is provided to emit a light, and the value of ratio between the first luminous intensity and the second luminous intensity is larger than 5 or larger than 10.

Figure 6A:
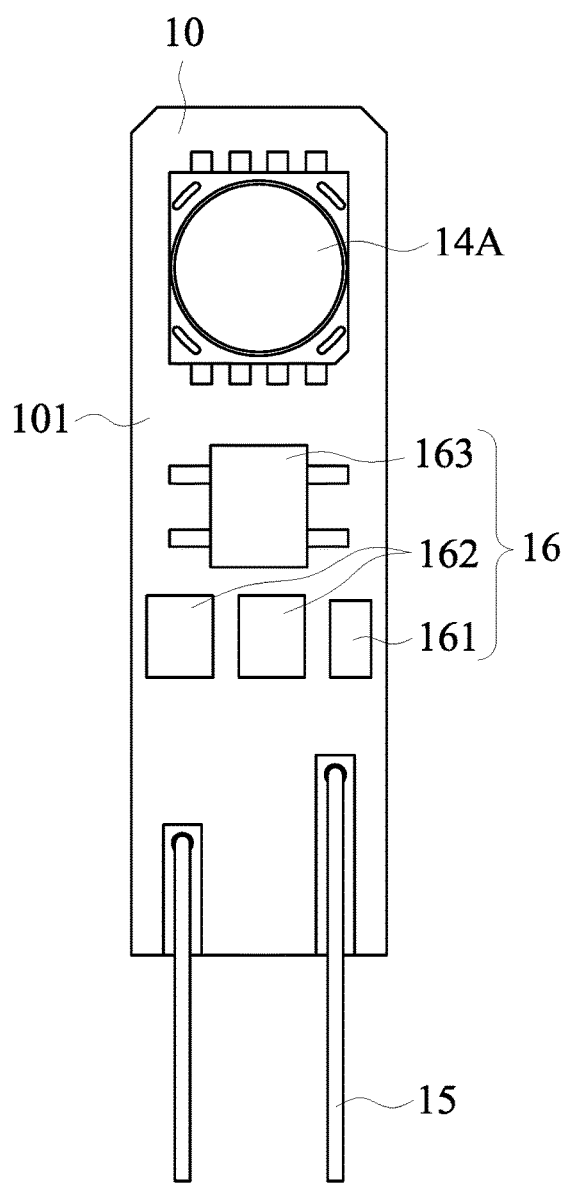
FIGS. 6A-6E show a process diagram of making a lighting structure in accordance with an embodiment of the present disclosure.
Figure 6B:
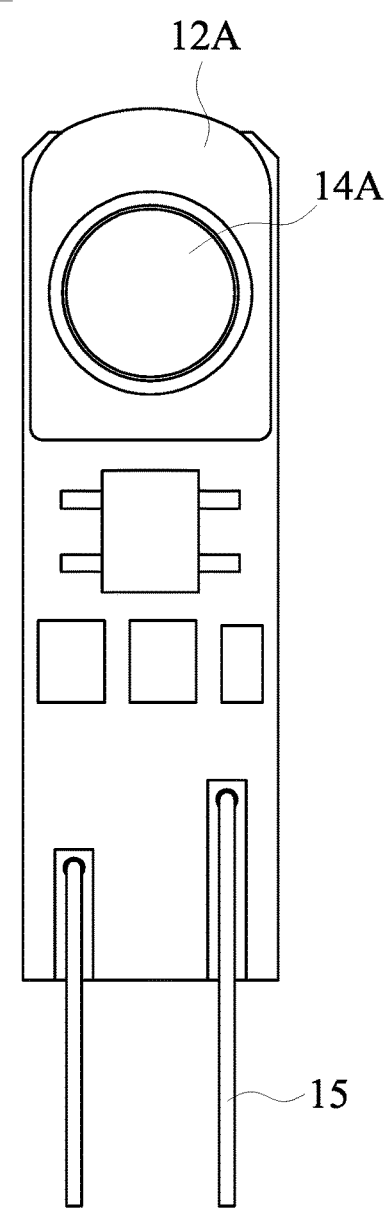

FIGS. 6A-6E show a process diagram of making a lighting structure in accordance with an embodiment of the present disclosure. Referring to FIG. 6A, a first light-emitting element 14A, electrical elements 16, and the electrical connector 15 are fixed to the carrier 10 through a surface mount technology (SMT) to form a lighting structure 11. Alternatively, electrical elements 16 and the electrical connector 15 can be fixed to the carrier 10 through a dip process. FIG. 6A shows only one side of the lighting structure, and the structure of the other side can be referred to other related figures and paragraphs. Referring to FIG. 6B, a cover element 12A is applied to be formed on the first light-emitting element 14A and to expose a part of the first light-emitting element 14A.

Figure 6C:
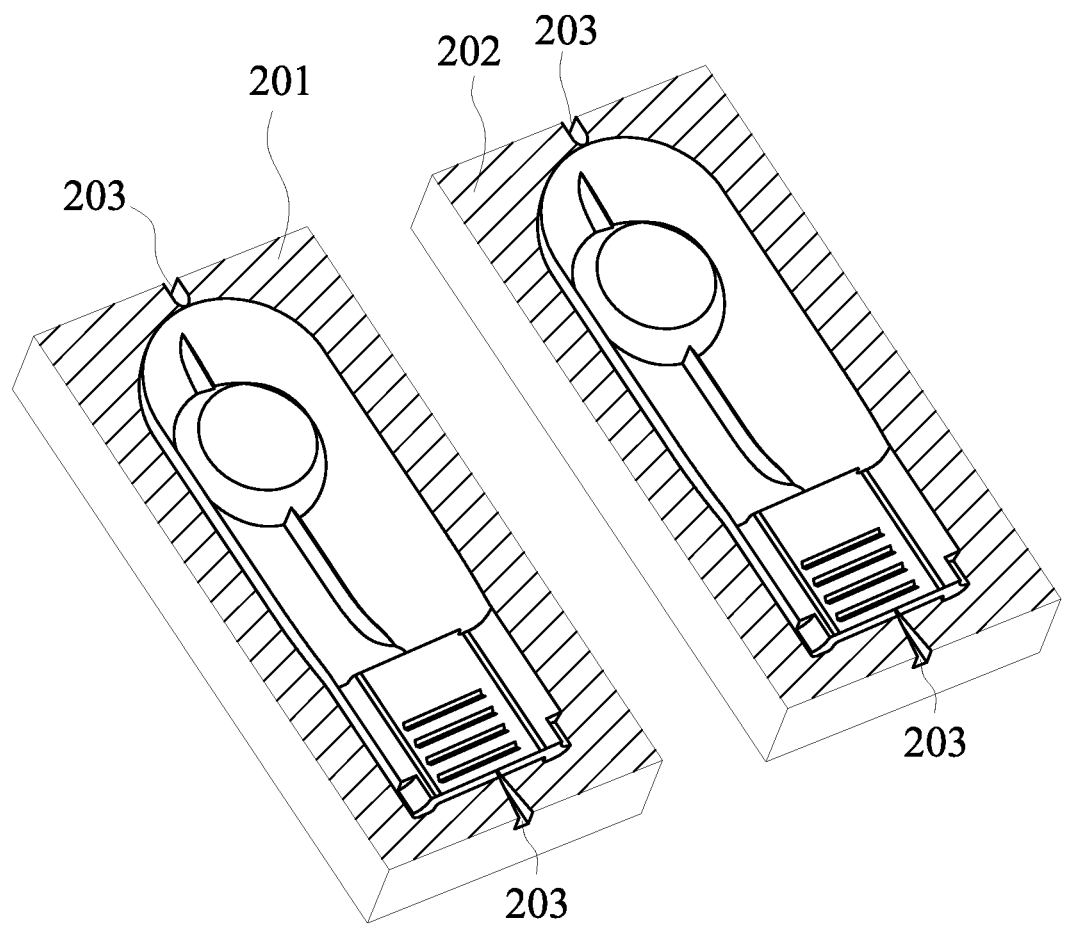
Figure 6D:
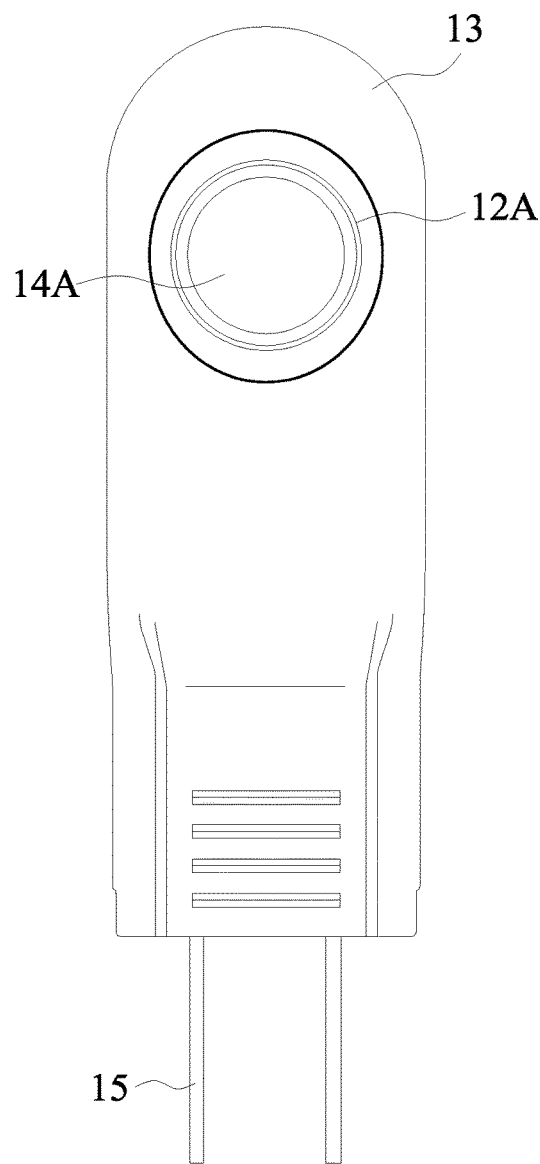

Then, referring to FIGS. 6C and 6D, a top mold 201 and a bottom mold 202 are provided. Each mold 201 and 203 has its own runner 203. During manufacturing, a lighting structure 11 is formed on the top mold and within the bottom mold 202. Then, the top mold 201 and a bottom mold 202 are sealed, and a thermoplastic material is injected into the mold 201 and 202 along the runner under a temperature between 235~270° C. and a pressure between 75~115 Mpa. At last, the temperature of the mold 201 and 202 is decreased to a range between 60~100° C. to fix the contour of the thermosetting material and form a cover body 13 to expose the first light-emitting element 14A and the electrical connector 15. The above method is to describe an injection molding manufacturing process. In another embodiment, a compression molding manufacturing process can also be applied to form the cover body 13. In this embodiment, referring to FIG. 3B, each of the distances between the filler 144 and the support body 141 in four directions is less than 1 mm (referring to D1~D4 in FIG. 3B). So, during forming the cover body 13, the cover body 13 covers the filler 144 and further influence the luminous intensity and the light field of the lighting apparatus 100. Therefore, as shown in FIG. 6B, a cover element 12A is provided to cover the light-emitting element 14A first to provide a room or distance (referring to D5~D8 in FIG. 3B), and the cover body 13 merely cover the cover element 12A without covering the filler 144 while forming the cover body 13. In another embodiment, when the distances between the filler 144 and the support body 141 in four directions are not less than 1 mm (1 mm≤D1<2 mm, 1 mm≤D2<2 mm, 1 mm≤D3<3 mm, 1 mm≤D4<3 mm), the process in FIG. 6B can be omitted, and no additional cover element 12A is needed to be formed on the first light-emitting element 14A.

Because the cover body 13 is formed by molding, the cover body 13 is a solid article. The cover body 13 is directly contacted with the carrier 10, electrical elements 16 and the electrical connector 15, and only a small amount of or none of air is existed in the cover body 13. Furthermore, the cover body 13 benefits the heat conduction to the environment. In this embodiment, the cover body 13 is a thermoplastic material. The thermoplastic material has a heat conduction coefficient larger than 1.5 W/Mk and a heat deflection temperature (HDT) larger than 100° C.

Figure 6E:
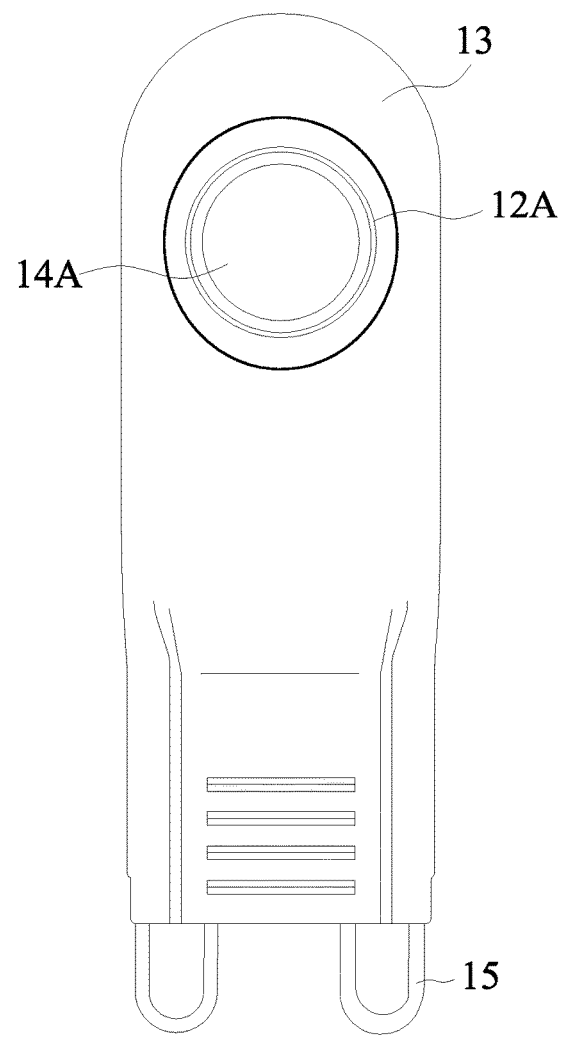

Referring to FIG. 6E, the electrical connector 15 is bent to complete the lighting apparatus 100. After bending, the electrical connector 15 meets the lighting apparatus criteria of G9. Or, in another embodiment, the electrical connector 15 is not bent to meet the lighting apparatus criteria of G4, GU10, etc.

In the above embodiments, the light-emitting elements 14A and 14B are exposed to the environment. The lighting structure 11 can directly perform a heat exchange process to get better heat dissipation effect. Besides, the cover body 13 is helpful for dissipating heat from the lighting structure 11 to the environment. The material of the carrier 10 is also helpful to dissipate the heat generated from the light-emitting elements 14A and 14B to entire carrier 10 when the carrier 10 is made of aluminum, and the locations of the light-emitting elements 14A and 14B will not be a hot spot. To sum up, all the above designs enable the lighting apparatus 100 to consume a power ranging between 1~5 Watt or 3~5 Watt while connecting to a power, and provides a luminous flux larger than 350 lumens or larger than 400 lumens under a (heat) stable state. The average temperature of the carrier 10 is less than 120° C., and that of the cover body is less than 105° C. The luminous flux can be measured by an integrating sphere (such as product numbered LBMS-500 manufactured by AMA Optoelectronics Inc.) The sentence of "light-emitting elements 14A and 14B are directly exposed to the environment" means the user can see and touch the light-emitting elements 14A and 14B directly. Or, the sentence of "light-emitting elements 14A and 14B are directly exposed to the environment" means the light generated from the major lighting direction of a light-emitting unit 143 will not pass through a material having a refractive index larger than 1.1.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A lighting apparatus, comprising:
    a carrier having a first surface and a second surface opposite to the first surface;
    a first light-emitting element formed on the first surface;
    a second light-emitting element formed on the second surface;
    a cover element formed on the first light-emitting element and having a hole to expose the first light-emitting element; and
    a cover body covering the carrier and exposing the first light-emitting element and the second light-emitting element and having openings to expose the first light-emitting element and the second light-emitting element.

2. The lighting apparatus according to claim 1, wherein the lighting apparatus consumes a power ranging between 1~5 Watt.

3. The lighting apparatus according to claim 1, wherein the carrier has an average temperature less than 120° C.

4. The lighting apparatus according to claim 1, wherein the second light-emitting element is formed on the second surface at a position overlapping with the first light-emitting element.

5. The lighting apparatus according to claim 1, wherein the second light-emitting element is connected to the first light-emitting element in parallel.

6. The lighting apparatus according to claim 1, wherein the cover body comprises a recess where the first light-emitting element is located in.

7. The lighting apparatus according to claim 1, further comprising a support body having a bottom part and a side part, wherein the first light-emitting element comprises a plurality of light-emitting units formed on the bottom part.

8. The lighting apparatus according to claim 1, further comprising a center point of the carrier, a virtual circle with a center positioned at the center point, and a luminous intensity distributed on the virtual circle, wherein the luminous intensity is between 0~2 cd.

9. A lighting apparatus, comprising:
    a carrier having a top surface;
    a light-emitting element, formed on the top surface, comprising:
        a support body having a bottom surface and defining an inner space;
        a light-emitting unit disposed in the inner space; and
        a conductive structure connected to the light-emitting unit and having a surface coplanar to the bottom surface;
    a cover element formed on the light-emitting element; and
    a cover body covering the cover element and the carrier, and exposing the first light-emitting element.

10. The lighting apparatus according to claim 9, wherein the cover element has a first end connected to the light-emitting element and a second end being coplanar with the top surface.

11. The lighting apparatus according to claim 9, further comprising a filler filled in the inner space.

12. The lighting apparatus according to claim 11, wherein the cover element has a hole with a size smaller than the filler.

13. The lighting apparatus according to claim 11, wherein the filler comprises phosphor particles, diffusing particles or both.

14. The lighting apparatus according to claim 9, further comprising a heat dissipating portion having a surface coplanar with the bottom surface.

15. The lighting apparatus according to claim 1, wherein the first light-emitting element and the second light-emitting element have at least one different characteristic.

16. The lighting apparatus according to claim 15, wherein the characteristic comprises size, color, light-emitting angle, or CRI.

17. The lighting apparatus according to claim 1, further comprising an electrical connector formed on the carrier and covered by the cover body.

18. The lighting apparatus according to claim 1, wherein the first light-emitting element comprises a light-emitting unit and a filler covering the light-emitting unit.

19. The lighting apparatus according to claim 18, wherein the cover body has a highest point and the filler does not exceed the highest point.

20. The lighting apparatus according to claim 18, wherein the filler is exposed from the cover body.

* * * * *